United States Patent [19]
Fabricius

[11] 3,969,683
[45] July 13, 1976

[54] AUTOMATIC LEVEL CONTROL CIRCUIT

[75] Inventor: Wayne Nixon Fabricius, Freehold, N.J.

[73] Assignee: Bell Telephone Laboratories, Incorporated, Murray Hill, N.J.

[22] Filed: Apr. 21, 1975

[21] Appl. No.: 569,810

[52] U.S. Cl............................ 330/144; 330/124 R; 330/129
[51] Int. Cl.² ........................................ H03G 3/20
[58] Field of Search............. 330/29, 57, 86, 124 R, 330/127, 129, 144, 145, 135

[56] References Cited
UNITED STATES PATENTS

| | | | |
|---|---|---|---|
| 3,308,392 | 3/1967 | McCarter............................ | 330/144 |
| 3,464,022 | 8/1969 | Locheed et al. ..................... | 330/144 |
| 3,684,968 | 8/1972 | Carroll............................... | 330/135 X |
| 3,879,672 | 4/1975 | Milanes.............................. | 330/29 |

*Primary Examiner*—James B. Mullins
*Attorney, Agent, or Firm*—John Francis Moran

[57] ABSTRACT

An automatic level control circuit utilizes digital techniques in the gain control loop to maintain an output signal within a predetermined amplitude range. A comparator circuit, which has preselected limits or threshold levels that establish the predetermined amplitude range, produces a hysteresis property in its operation. The hysteresis provides a substantial improvement in noise immunity over conventional automatic gain control circuits. The output of the comparator is applied to digital circuitry which controls the variable gain of a linear amplifier. The digital circuitry also includes a preset circuit which sets the gain of the variable amplifier to the middle of its range, thereby reducing the average time required for an input signal to produce an output signal within the predetermined range. In addition, a decoder indicates the level of the input signal and an out-of-range circuit indicates the relative magnitude of an input signal when it is not within the input range capability of the automatic level control circuit.

7 Claims, 5 Drawing Figures

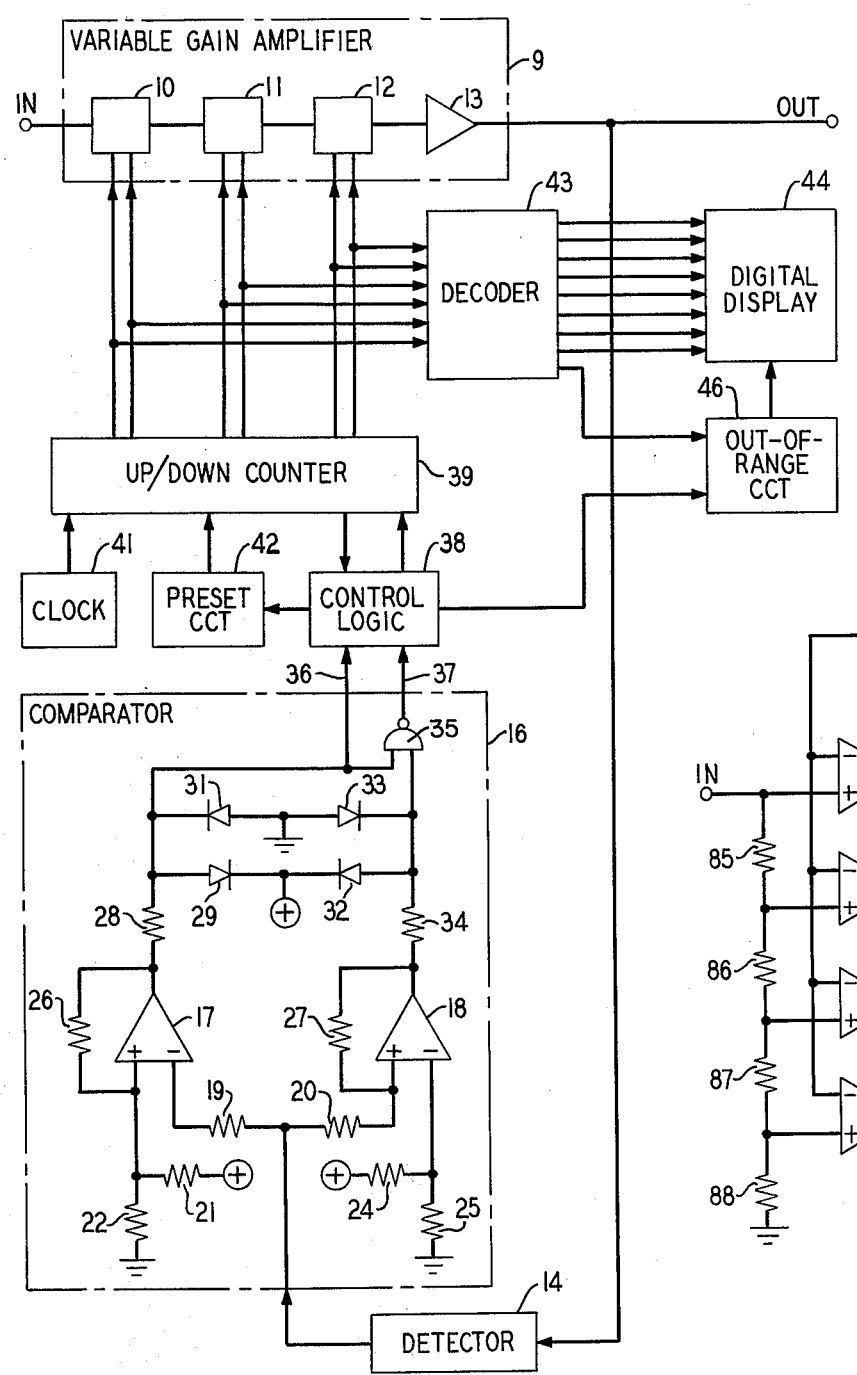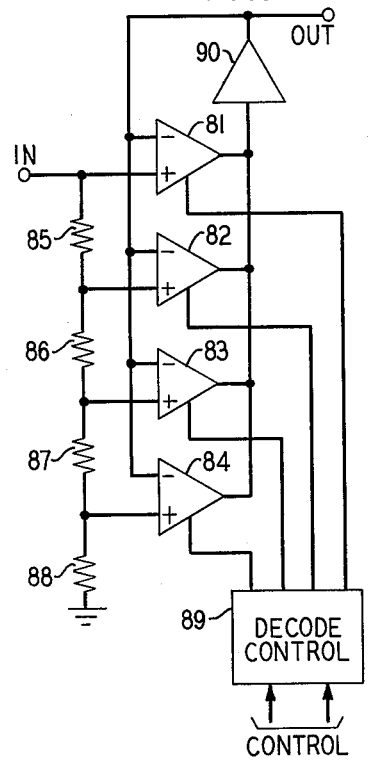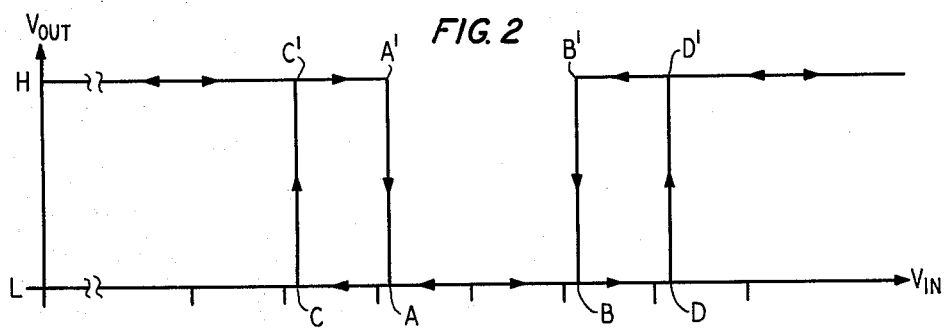

FIG. 4

TRUTH TABLE

| WORD NUMBER | ADDRESS | | | | | OUTPUT | | | | | | | |
|---|---|---|---|---|---|---|---|---|---|---|---|---|---|
| 0 | 0 | 0 | 0 | 0 | 0 | 0 | 0 | 1 | 0 | 0 | 0 | 0 | 0 |
| 1 | 0 | 0 | 0 | 0 | 1 | 0 | 0 | 0 | 1 | 1 | 1 | 0 | 0 |
| 2 | 0 | 0 | 0 | 1 | 0 | 0 | 0 | 0 | 1 | 1 | 0 | 1 | 1 |
| 3 | 0 | 0 | 0 | 1 | 1 | 0 | 0 | 0 | 1 | 1 | 0 | 1 | 0 |
| 4 | 0 | 0 | 1 | 0 | 0 | 0 | 0 | 0 | 1 | 1 | 0 | 0 | 1 |
| 5 | 0 | 0 | 1 | 0 | 1 | 0 | 1 | 1 | 1 | 1 | 1 | 1 | 1 |
| 6 | 0 | 0 | 1 | 1 | 0 | 0 | 1 | 1 | 1 | 1 | 1 | 1 | 1 |
| 7 | 0 | 0 | 1 | 1 | 1 | 0 | 1 | 1 | 1 | 1 | 1 | 1 | 1 |
| 8 | 0 | 1 | 0 | 0 | 0 | 0 | 0 | 0 | 1 | 1 | 0 | 0 | 0 |
| 9 | 0 | 1 | 0 | 0 | 1 | 0 | 0 | 0 | 1 | 0 | 1 | 0 | 0 |
| 10 | 0 | 1 | 0 | 1 | 0 | 0 | 0 | 0 | 1 | 0 | 0 | 1 | 1 |
| 11 | 0 | 1 | 0 | 1 | 1 | 0 | 0 | 0 | 1 | 0 | 0 | 1 | 0 |
| 12 | 0 | 1 | 1 | 0 | 0 | 0 | 0 | 0 | 1 | 0 | 0 | 0 | 1 |
| 13 | 0 | 1 | 1 | 0 | 1 | 0 | 1 | 1 | 1 | 1 | 1 | 1 | 1 |
| 14 | 0 | 1 | 1 | 1 | 0 | 0 | 1 | 1 | 1 | 1 | 1 | 1 | 1 |
| 15 | 0 | 1 | 1 | 1 | 1 | 0 | 1 | 1 | 1 | 1 | 1 | 1 | 1 |
| 16 | 1 | 0 | 0 | 0 | 0 | 0 | 0 | 0 | 1 | 0 | 0 | 0 | 0 |
| 17 | 1 | 0 | 0 | 0 | 1 | 0 | 0 | 0 | 0 | 1 | 1 | 0 | 0 |
| 18 | 1 | 0 | 0 | 1 | 0 | 0 | 0 | 0 | 0 | 1 | 0 | 1 | 1 |
| 19 | 1 | 0 | 0 | 1 | 1 | 0 | 0 | 0 | 0 | 1 | 0 | 1 | 0 |
| 20 | 1 | 0 | 1 | 0 | 0 | 0 | 0 | 0 | 0 | 1 | 0 | 0 | 1 |
| 21 | 1 | 0 | 1 | 0 | 1 | 0 | 1 | 1 | 1 | 1 | 1 | 1 | 1 |
| 22 | 1 | 0 | 1 | 1 | 0 | 0 | 1 | 1 | 1 | 1 | 1 | 1 | 1 |
| 23 | 1 | 0 | 1 | 1 | 1 | 0 | 1 | 1 | 1 | 1 | 1 | 1 | 1 |
| 24 | 1 | 1 | 0 | 0 | 0 | 0 | 0 | 0 | 0 | 1 | 0 | 0 | 0 |
| 25 | 1 | 1 | 0 | 0 | 1 | 0 | 1 | 1 | 1 | 1 | 1 | 0 | 0 |
| 26 | 1 | 1 | 0 | 1 | 0 | 0 | 1 | 1 | 1 | 1 | 0 | 1 | 1 |
| 27 | 1 | 1 | 0 | 1 | 1 | 0 | 1 | 1 | 1 | 1 | 0 | 1 | 0 |
| 28 | 1 | 1 | 1 | 0 | 0 | 0 | 1 | 1 | 1 | 1 | 0 | 0 | 1 |
| 29 | 1 | 1 | 1 | 0 | 1 | 0 | 1 | 1 | 1 | 1 | 1 | 1 | 1 |
| 30 | 1 | 1 | 1 | 1 | 0 | 0 | 1 | 1 | 1 | 1 | 1 | 1 | 1 |
| 31 | 1 | 1 | 1 | 1 | 1 | 0 | 1 | 1 | 1 | 1 | 1 | 1 | 1 |

AUTOMATIC LEVEL CONTROL CIRCUIT

BACKGROUND OF THE INVENTION

This invention relates generally to signal level control circuits and, more particularly, to variable gain amplifers that utilize digital circuitry for changing the gain to effect automatic signal level control.

In most all of the commonly employed communication systems or measurement systems, signal level control circuits are commonly used at some point in the system to maintain a more or less constant signal level output. Natural phenomena, randomly occurring, or unknown conditions all can produce undesirable variations in the level of a signal. These level variations must usually be substantially minimized by some type of gain control circuit before the signal can be effectively utilized to provide reliable operation.

Most conventional gain control circuits are of the analog variety. Such circuits usually must employ a nonlinear element to control amplifier gain, such as a diode or field effect transistor, to make full use of the dynamic range in gain available from a given amplifier. Unfortunately, the nonlinear element also introduces harmonic distortion into the signal whose level is being maintained constant at the output of the gain control circuit. The operation of these analog circuits also makes it difficult to provide an accurate indication of the level of signal being applied to the gain control circuit from within the circuit because the response to changes in level of the input signal produced nonlinear variations in the control signal applied to the nonlinear device which is the source of the input level information.

Recently, digital gain control circuits have come into being which offer advantages over their analog equivalents. In digital gain control circuits the circuit elements which are used to effect gain control are linear and do not serve as a source of distortion. Digital control circuits are clocked and can be readily synchronized with timing operations of other control circuits to perform operations within predetermined intervals, thereby enhancing the performance of the system. A principal drawback common to both analog and digital gain control circuits is that unavoidable and erratic high noise levels, which are often present in the signal, deleteriously effect the stability of gain control circuits and disrupt their operation.

An object of this invention is to improve substantially the stability of automatic gain control circuits while operating in a high noise ambient by providing immunity thereto.

Another object of the invention is to produce digital signals indicative of the level of the signal applied to automatic gain control circuits by the response of same to the level of signal.

SUMMARY OF THE INVENTION

In its broader aspects, the invention takes the form of an automatic signal level control circuit in which a variable gain amplifier is connected to receive an input signal and supplies an output signal to a comparator. The comparator has an upper predetermined limit and a lower predetermined limit which are used to produce an output signal indicative of the level of the amplifier signal relative to the limits therein. Digital circuitry responsive to the comparator controls the gain of the amplifier to maintain its output between the limits of the comparator. The comparator includes feedback which introduces hysteresis in its operation and improves the overall stability of the level control circuit. The hysteresis serves to set tighter limits for initial stabilization of the digital control circuitry and relaxes those limits after stabilization so that substantial noise immunity is produced from the significant amount of noise that may be present when the amplified signal passes through one of the predetermined limits.

In some of its more specific aspects, the invention includes a comparator that comprises two operational amplifiers wherein positive feedback resistors are employed to provide the hysteresis characteristic which improves the stability of the level control circuit. In addition, the variable gain amplifier comprises a plurality of stages of variable attenuation followed by a fixed gain amplifier. The digital control circuit produces a plurality of digital signals that serve to change the attenuation of the stages of variable attenuation. In accordance with these aspects, the digital signals are also applied to a decoder in order to provide a digital indication of the level of the input signal applied to the level control circuit.

In some further aspects of the invention, the control circuit includes a preset circuit for setting the variable attenuator to midrange when an input signal is first applied to the level control circuit, thereby reducing the average time required for the level of output signal to reach a predetermined amplitude range established by the two limits or threshold levels of the comparator. Also included in the control circuitry is an out-of-range circuit. The out-of-range circuit indicates whether the amplitude of the input signal applied to the level control circuit is too small or too large for the variable range of the attenuator to attain an output signal which has an amplitude within the predetermined range established by the limits of the comparator.

BRIEF DESCRIPTION OF THE DRAWING

FIG. 1 is a block diagram of an illustrative embodiment of the invention that includes a detailed circuit of the comparator utilized therein.

FIG. 1A illustrates a stage of variable attenuation that may be utilized in the variable gain amplifier of FIG. 1.

FIG. 2 illustrates the transfer characteristic of the comparator in FIG. 1.

FIG. 4 is a table which depicts the contents and structure of the memory utilized in the decoder of FIG. 1.

DETAILED DESCRIPTION

Figure 3:
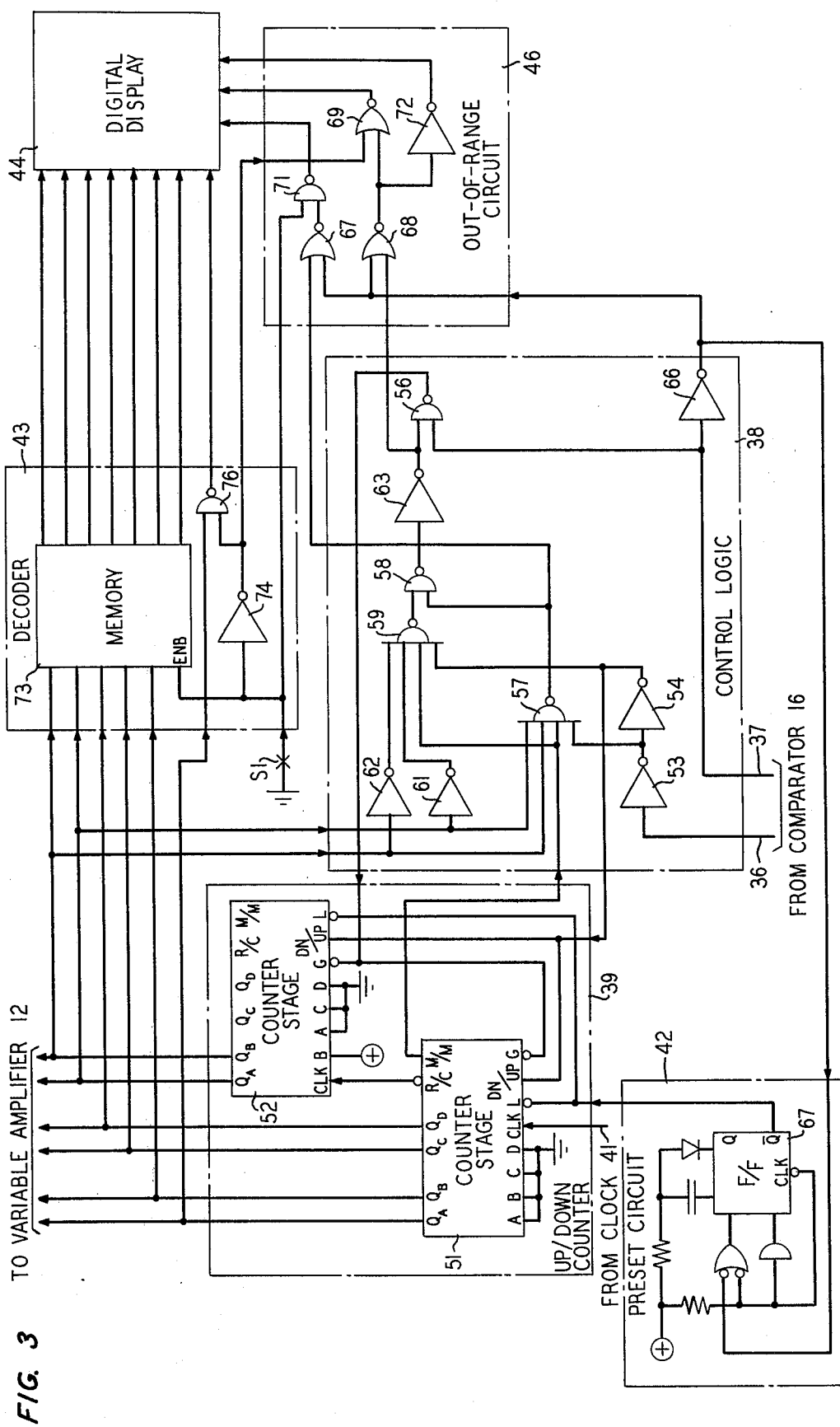
FIG. 3 is a detailed diagram illustrating detailed information of the block components in FIG. 1.

The through signal path of the digital automatic level control of FIG. 1 comprises a variable gain amplifier 9 including serially connected stages 10–13 which extend from the input to the output of the level control circuit. The output signal of amplifier 9 is also applied to detector 14 which produces a d.c. output proportional to the absolute amplitude of its input signal (e.g., full-wave average). The output of detector 14 is applied to comparator 16 which produces two outputs on conductors 36 and 37 for control logic 38. Control logic 38 mainly serves to activate up/down counter 39 and senses when the counter reaches the limits of the count therein. Counter 39 also receives an input from clock 41 and preset circuit 42. Clock 41 controls the rate at which counter 39 proceeds to count. Preset circuit 42 sets counter 39 to the mid-point of its count whenever a new input signal is first applied to variable gain amplifier 9.

The output of counter 39 provides digital control signals which determine the amount of gain that variable gain amplifier 9 presents to the input signal applied thereto. In this illustrative embodiment of the invention, as the count of counter 39 increases, the concurrent effect on variable gain amplifier 9 is that attenuation levels are changed in the various stages 10–13, thereby decreasing the gain or increasing the attenuation of the amplifier in logarithmic increments.

It should be understood that the term gain as used herein is broadly defined as the amplitude of the output signal divided by the amplitude of the input signal of variable gain amplifier 9. The value of the gain may therefore be less than unity or greater than unity. The value of the gain of amplifier 9 dictates the characteristics and even the specific form that the amplifier takes on. It should be understood that, while variable gain amplifier 9 is shown comprising three stages 10–12 of variable attenuation and an amplifier 13, other combinations of different numbers of stages of attenuation or amplification may be used therein.

The digital control signals of counter 39 are also applied to decoder 43 which produces a digital output signal to drive digital display 44. Decoder 43 converts the information contained in the digital control signals produced by counter 39 into a further set of digital signals indicative of the level of the input signal applied to variable gain amplifier 9. The operation of decoder 43 will be discussed more fully hereinafter in connection with FIG. 4.

Control logic 38 and decoder 43 each produce an output which is applied to out-of-range circuit 46. Whenever the amplitude of the input signal applied to the level control circuit is outside of the variable range of amplifier 9 so that it and detector 14 cannot provide a signal within the threshold limits of comparator 16, the level of the input signal is considered out-of-range. In response to this condition, the out-of-range circuit 46 produces an output indicative of an "out-of-range input signal" for digital display 44.

FIG. 1A will be discussed before the details of the circuitry of comparator 16 in FIG. 1 is described. FIG. 1A depicts an example of the type of circuit which may be utilized as one of stages 10–13 of variable gain amplifier 9 in FIG. 1. The input of FIG. 1A is applied to linear amplifiers 81–84 via the voltage divider comprising resistors 85–88. Amplifiers 81–84 are controlled by decoder 89. Decoder 89 has two binary inputs whose states determine which one of amplifiers 81–84 is connected to linear amplifier 90 to provide the through signal path. As is readily apparent from FIG. 1A, when amplifier 81 is active the overall attenuator is the least while the activation of amplifier 84 provides the greatest amount of attenuation which is provided by the circuit of FIG. 1A. An advantage of using the configuration of FIG. 1A is that such an arrangement, not including resistors 85–88 which are discrete components, is commercially available in integrated circuit form (e.g., the HA-2405 by Harris Semiconductor).

The active components of comparator 16, which is schematically depicted in FIG. 1, comprise differential operational amplifiers 17 and 18 and NAND gate 35. The output of detector 14 is applied to the inverting terminal of amplifier 17 via resistor 19 and to the non-inverting terminal of amplifier 18 via resistor 20. A divider network comprising resistors 21 and 22 determines the upper threshold level of amplifier 17 to which the output of detector 14 is compared. Resistors 24 and 25 comprise a second voltage divider network which produces the voltage reference level of the lower threshold for the remaining input of amplifier 18. Hysteresis in the operation of amplifier 17 is introduced by positive feedback resistor 26 while the hysteresis of amplifier 18 is introduced by positive feedback resistor 27. The output of amplifier 17 is converted into a binary control signal via a network comprising resistor 28 and oppositely poled diodes 29 and 31. A similar network comprising oppositely poled diodes 32 and 33 and resistor 34 translates the level of the output of amplifier 18 into a control signal compatible with the operation of gate 35 and logic 38.

FIG. 2 provides an insight into the operation of comparator 16 by illustrating the transfer characteristic of the comparator. More specifically, FIG. 2 depicts the relationship of the output of NAND gate 35 with respect to the input to comparator 16 which is provided by detector 14. The output of gate 35 is applied to control logic 38 via conductor 37. Conductor 36, which is in circuit with the output of amplifier 17, provides additional information for control logic 38.

Whenever the input signal to comparator 16 falls within the range in FIG. 2 bounded by points A and B, both amplifiers 17 and 18 produce a high level output which forces the output of gate 35 on conductor 37 into a low or logical "0" state. If the input voltage to comparator 16 drifts in the range between points A and C or points B and D, the output of NAND gate 35 is dependent upon whether the input voltage was initially within the range between points A and B, or outside this range. This operation is depicted by the arrows shown on the transfer characteristic in FIG. 2. For instance, if the input voltage to comparator 16 as applied by detector 14 initially falls outside of the range between points A and B, the output of NAND gate 37 remains high and the output of amplifier 17 at conductor 36 indicates the direction in which up/down counter 39 is to proceed to obtain the proper amount of gain in variable amplifier 12. For the output of NAND gate 35 to change to the "0" state, the gain of variable amplifier 12 must be adjusted so that the output of detector 14 falls between points A and B.

Once the output of detector 14 falls between points A and B, the output of NAND gate 35 remains low until the output of detector 14 shifts below point C or above point D. Therefore, the rectangles labeled A, A', C', C and B, B', D', D illustrate the effect of hysteresis upon the operation of comparator 16. This hysteresis provides immunity from the significant amount of noise which may be present in the output of detector 14 as the signal passes through one of the threshold levels of comparator 16. Consequently, once the output of detector 14 falls between points A and B, the noise present on the input signal must be sufficiently high to shift the output of detector 14 below point C or above point D. If either condition occurs, the output of NAND gate 35 switches to the "1" level and enables counter 39. As the value of the count in counter 39 changes so does the gain of amplifier 9 until the output of detector 14 falls within points A and B and the gain control loop stabilizes. In the stable state, counter 39, control logic 38 and all other circuitry remains static. That is, no change will occur in the gain of amplifier 9 as long as the output of detector 14 remains between points C and D in FIG. 2.

FIG. 3 provides additional detailed information concerning the illustrative embodiment of the invention shown in FIG. 1. Control logic 38 of FIG. 3 comprises an arrangement of conventional logic gates. Preset circuit 42 of FIG. 3 comprises a conventional monostable multivibrator. Decoder 43 comprises a read-only memory and a few logic gates and will be discussed hereinafter in connection with the table of FIG. 4. Out-of-range circuit 46, like control logic 38, comprises an arrangement of conventional logic gates.

Up/down counter 39 basically comprises two stages 51 and 52 which are enabled and controlled by the same signals. Each stage of counter 39 is a synchronous up/down Binary Coded Decimal (BCD) counter. Four synchronous flip-flops and a steering logic gating network are included in each stage. Synchronous operation is provided in each stage by simultaneously clocking all four of the internal flip-flops. Access to the four flip-flops of each stage is obtained through the steering logic. The first input is the down/up input which determines the direction of count. The G input enables the count to proceed when it goes to ground potential. Each stage is fully programmable. That is, the outputs may be preset to any count by placing a ground potential on the load, L, input and entering the desired data at the four data inputs labeled A–D. Stage 51 is clocked directly by clock 41 of FIG. 1 while stage 54 is cascaded with the first stage and is therefore clocked from the ripple clock output of stage 54. All four of the counting outputs of stage 51 are applied to variable amplifier 12 while only two outputs of stage 52 are applied to that amplifier. The stages of counter 39 may be realized by conventional integrated circuits which are available commercially. For example, the SN74LS190 integrated circuits made by Texas Instruments Incorporated are suitable for the purposes of the invention and are described in their *TTL Data Book*, First Edition, copyrighted 1973, at pages 416 through 427.

The operation of the circuitry in FIG. 3 will be described to provide an overview of the functions of the various circuit components in response to selected input conditions relying only upon the essential elements responsible for the operational response thereto.

The first selected input condition occurs when no input signal is supplied to the level control circuit of FIG. 1. This response is the same when an input signal is applied but the level is insufficient to exceed the lower threshold of comparator 16. As previously described in connection with FIG. 1, the level of the output of detector 14 applied to comparator 16 is negligible and is less than the threshold levels therein. Comparator 16 therefore produces a high signal on conductors 36 and 37. Cascaded inverters 53 and 54 connected to conductor 36 thus provide a high level signal for the down/up of stages 51 and 52 of counter 39. If stages 51 and 52 are in states which represent a count greater than all logical "0's," the inputs to control logic 38 derived from counter 39 are such that NAND gate 56 produces a low output to enable the counter. Counter 39 therefore down counts in accordance with the clock signal applied thereto until the count arrives at an all "0" state. Once this state is obtained, stage 51 and inverters 61 and 62 provide three inputs to NAND gate 59 of control logic 38 with high levels. These three inputs with the high level supplied by inverter 54 switch the output of gate 59 to a low level. At this time, gate 57 produces a high output signal which, in conjunction with the output of gate 59, forces the output of gate 58 to a high level which is applied to inverter 63. Inverter 63 produces a low output which is supplied to gate 64 in conjunction with the high signal on conductor 37. Accordingly, gate 64 produces a high output which inhibits both stages of counter 39 from counting. Now that the output of counter 39 represents a count of all "0's," the gain of amplifier 9 is maximum and produces minimum attenuation of the input signal. This assures maximum sensitivity of comparator 16 in the level control circuit of FIG. 1 to any input signal level applied thereto.

The next selected input condition is produced as a signal is first applied to the level control circuit of FIG. 1. At this point, it should be assumed that the amplitude of the input signal is within the variable range of amplifier 9 thereby assuring that detector 14 will produce an output signal between the two threshold levels of comparator 16 once the level control circuit stabilizes. Comparator 16 proceeds to produce a low signal on conductor 36 and a high signal on conductor 37. In this process a negative transition momentarily occurs on conductor 37 followed by a positive transition. From the positive transition, inverter 66 provides a negative transition in the output signal from control logic 38 to monostable multivibrator 67 of preset circuit 42. These transitions occur because the input signal first exceeds the lower threshold of amplifier 18 and then the higher threshold of amplifier 12. In response to the negative transition, preset circuit 42 produces an output pulse of a fixed duration which is applied to the L-inputs of stages 51 and 52 of counter 39. As previously discussed, the pulse applied to the L-inputs serves to preset stages 51 and 52 in accordance with the inputs A–D. Accordingly, stage 51 is set to a binary "0" state while the two outputs of stage 52 produce a binary 2 or "10" state. Variable amplifier 12, in response to the input signal from stage 52, is thus preset to the midpoint of its variable range.

At this point, the new output level produced by conductor 14 is evaluated by comparator 16. The response of counter 39 is contingent on the level of the signal present on conductor 36. If the amplitude of the input signal to the level control circuit is such that it falls within the lower region of gain of the variable range of amplifier 12, the signal presented to conductor 36 is a low signal. The low signal passes through serially connected inverters 53 and 54 to the two stages of counter 39. The low level signal directs the stages of counter 39 to increase their count, thereby reducing the output of detector 14 which is applied to comparator 16. When the output of detector 14 falls between the limits or threshold levels of comparator 16, a low level signal is produced on conductor 37 which is applied to NAND gate 56. This forces gate 56 to produce a high output which inhibits both stages of counter 39.

If, on the other hand, the amplitude of the input signal to the level control circuit has a lower level and falls within the higher region of gain of the variable range of amplifier 12, a high signal is provided by comparator 16 on conductor 36. Again, this high signal is applied to stages 51 and 52 of counter 39 via inverters 53 and 54. The low signal directs the stages of counter 39 to reduce their count, thereby increasing the gain of variable amplifier 12. Once the gain of variable amplifier 12 is sufficiently increased so that the output of detector 14 falls between the threshold levels of comparator 16, the comparator produces a low level output on conductor 37 which, through NAND gate 56, inhibits any further counting in the stages of counter 39.

If the amplitude of an input signal is sufficiently high as to be out-of-range, the circuitry of FIG. 3 will perform as follows. Again, preset circuit 42 will initially set the gain of variable amplifier 12 to the middle of its range. Control logic 38 will also proceed to produce output signals which direct the stages in counter 39 to increase their count. When the count of counter 39 increases to its maximum value, the four inputs to gate 57 are all high forcing it to produce a low output. The low output is applied to gate 58 which it passes on to gate 56 through inverter 63. This input to gate 56 with the signal present on conductor 37 forces the output of the gate to a high level which inhibits the count of the stages in counter 39.

Out-of-range circuit 46 comprises NOR gates 67, 68 and 69, NAND gate 71, and inverter 72. Inverter 72 and gates 69 and 71 supply the outputs of out-of-range circuit 46 for digital display 44. When the input signal applied to the level control circuit is within the range of variable amplifier 12, all of the outputs from the out-of-range circuit to digital display 44 remain high. Display 44, at this time, only serves to indicate the level of the signal applied to the level control circuit upon the closure of switch $S_1$ which enables decoder 43.

If the level of the input signal applied to the level control circuit is outside of the range of variable amplifier 12, the input signals to the out-of-range circuit from control logic 38 and decoder 43 change accordingly. At this time, inverter 72 serves to light an indicator light on digital display 44 which draws attention to the fact that the level of the input signal is either too great or insufficient to provide a constant output level.

If there is no input signal applied to the level control circuit, or the level of the signal is less than the minimum acceptable value, gate 69 produces a low level output signal, which results in the firing of the horizontal segment or minus portion of a polarity or sign signal on digital display 44 to indicate that the input level is low. These output signals from circuit 46 occur when inverter 63 produces a low output for gate 68; inverter 66 similarly produces a low output for gates 67 and 68 as gate 57 produces a high output for gate 67.

If the signal applied to the level control circuit is too high, the output of gate 57 switches to a low level, while all the other inputs to the out-of-range circuit remain the same. The result is that the output of gate 67 changes to a low level and forces the output of gate 71 to a low level. The output of gate 71 fires the vertical segment of the polarity signal on digital display 44. Accordingly, all the outputs of out-of-range circuit 46 are low so that the out-of-range indicator light is fired and both horizontal and vertical segments, or plus sign, of the polarity indicator are fired indicating that the input signal to level control circuit 46 is too high.

To read the level of the input signal applied to the level control circuit, switch $S_1$ must be closed. When switch $S_1$ is not conducting, display 44 may be used to provide a read-out for any one of other digital inputs in a system in which the level control circuit may be utilized. The closure of $S_1$ enables read-only memory 73 which provides a digital indication of the input level to digital display 44 and produces a low level signal for inverter 74. Inverter 74 produces a logical "1" output for one input of gate 69 while switch $S_1$ produces a low output for gate 71. The state of the input signals to out-of-range circuit 46 is such that gate 69 produces a low output signal, while gate 71 produces a high output signal, thus indicating that the level of the signal applied to the level control circuit is too low.

It should be noted that in this illustrative embodiment of the invention, which is generally depicted in FIG. 1 and shown in greater detail in FIGS. 1A and 3, that certain design criteria were utilized which play no part in the inventive concepts and principles disclosed herein. For example, the first stage of variable amplifier 9 has four input channels which are selected by two outputs of stage 51 of counter 39. Changes in the level of the two outputs from counter 39 applied to stage 10 of variable amplifier 9 alters the gain of that stage from 0 to −3dB in 1dB increments. Similarly, stage 11 of amplifier 9 also has four gain levels which range from 0dB to −12dB. The gain of this stage is incremented in 4dB steps in accordance with the outputs of counter 39. Finally, the last stage of variable amplifier 9 has a gain which ranges from 0dB to −30dB and changes under the control of counter 39 in 10dB increments. It should be noted that the resolution of the gain of variable amplifier 9 is 1dB which corresponds to the difference in level between the upper and lower thresholds of comparator 16. Counter 39 produces a count from 0 to 39 which alters the gain of amplifier 9 from 0 to −39dB. As the count is incremented by 1 in counter 39, the gain of amplifier 9 is reduced by 1dB. Preset circuit 42 and the data inputs A-D of stages 51 and 52, in this instance start the gain of variable amplifier 9 at −20dB when new input signal is applied to the level control circuit. In other applications of the invention the full range of variable gain amplifier 9 may provide more desirable performance than the limited range of 39dB used herein. Furthermore, the gain of amplifier 13 may be changed to provide different fixed values and additional amplifiers may readily be used at the input to the level control circuit to increase the gain of the signal applied to amplifier 9. By making these changes, one skilled in the art can readily shift the variable gain range of amplifier 9 to coincide with any desired amplitude spectrum.

FIG. 4 is a truth table which describes the structural contents of memory 73 of decoder 43. Memory 73 may be a standard 256 bit read-only memory which is either custom masked or programmed in accordance with the truth table of FIG. 4. The general operation of read-only memories and design criteria to be considered and their utilization appears in an article entitled "There is a Read-Only Memory to Fill Your Needs," by J. Marino and J. Sirota, at page 112 of the Mar. 16, 1970 issue of *Electronics* magazine (Vol. 43, No. 6), published by McGraw-Hill. Memory 73 has five address inputs which are connected to the output of counter 39 and an enable input which is controlled by switch $S_1$. When switch $S_1$ is depressed to conduct, the seven outputs of memory 73 are produced in accordance with the adddress inputs applied to the memory. In addition to memory 73 decoder 43 also comprises inverter 74 and NANd gate 76. Upon the closure of switch $S_1$ gate 76, which has one input connected to stage 51 of counter 39, provides either a low or high output. This output from gate 76 contributes to the value of the least significant digit displayed by display 44. The outputs of memory 73 and gate 76 provide a parallel set of BCD signals indicative of the level of the received signal in a two digit read out for display 44.

It should be noted that memory 73 and the other circuitry of decoder 43 are designed to produce a digital indication of the root-mean-square (rms) value of the level of the input signal of the automatic level circuit. Additionally, the coding design of memory 73 has to take into account the type of detector that is utilized as detector 14 and the relationship of the rms value in the type of input signal with respect to the output of detector 14. The input signal is terminated into a 600 ohm impedance and has an acceptable range from −2 to −41dBm. Therefore, when switch $S_1$ is conducting, inverter 74 produces a high level output which forces the output of gate 69 low so that a minus sign is indicated by display 44 for the range of −2 to −41dBm.

It should be understood that a complex network of random logic may be used to provide the complete operation of decoder 43. However, the use of read-only for memory 73 is advantageous for a number of reasons. For example, simple replacement of memory 73 by another memory which has a different internal construction provides a convenient way to display the peak or full-wave average value instead of the rms value which is generated from the operation depicted by the truth table in FIG. 4. Another advantage is that simple substitution of the memory 73 with appropriate addition of amplification of the input signal of the level control circuit or a change in the gain of amplifier 13 enables the amplitude spectrum of the variable range of amplifier 9 to be shifted accordingly. With the former change, the option is available to have memory 73 in decoder 43 indicate the level of the input signal before or after the additional amplification.

What is claimed is:

1. An automatic signal level control circuit comprising:
    amplifying means connected to receive an input signal and having variable gain that changes in precisely defined discrete increments to provide an output signal whose magnitude is variable independent of the level of the input signal,
    comparing means having an upper predetermined limit and a lower predetermined limit for evaluating the amplitude of said output signal, said comparing means having feedback means to provide hysteresis in its transfer characteristic, and said comparing means producing an output signal indicative of the amplitude of said output signal relative to said limits as the hysteresis in the transfer characteristic therein provides substantial noise immunity in the indication of said output signal of said comparing means from the significant amount of noise that may be present on said output signal when it passes through one of said limits,
    digital means for controlling the gain of said amplifying means comprising logic means and up/down counting means, said logic means responsive to the output of said comparing means, said counting means being enabled and inhibited by said logic means, and said counting means having counting states and associated outputs that control the gain of said amplifying means to maintain its output between said limits,
    and decoding means responsive to the associated outputs of said counting means for providing a set of digital signals indicative of the level of the input signal being received by said amplifying means, said decoding means comprising read-only memory means, inverting means, gating means connected to the output of said counting means, and switching means for applying ground potential to said read-only memory means and said gating means to produce the set of digital signals.

2. An automatic signal level control circuit in accordance with claim 1 wherein said comparing means comprises two differential operational amplifiers, each having one input referenced to one of said predetermined limits, means for applying said output signal to the other input of each of said differential amplifiers, said feedback means including a resistive means for providing positive feedback to each of said differential amplifiers, and output means in circuit with one of said differential amplifiers providing a first signal indicative of the relative position of the amplitude of said output signal with respect to one of said limits and second output means in response to the output of both of said differential amplifiers for indicating when said output signal is between said limits.

3. An automatic signal level control circuit in accordance with claim 2 wherein said amplifier means comprises a variable attenuator and an amplifier serially connected in cascade, said variable attenuator comprising a plurality of stages serially cascaded to provide selected quantities of attenuation in accordance with the output of said counting means, and said decoding means indicates the level of the input signal received by said amplifying means in decibels.

4. An automatic signal level control circuit in accordance with claim 3 further comprising detecting means connected between the output of said amplifying means, and the input of said comparing means for supplying an input signal proportional to the magnitude of the output signal from said amplifier means so that said comparing means evaluates the absolute level of the output signal.

5. An automatic signal level control circuit in accordance with claim 4 wherein said digital means further comprises clocking means for determining the counting rate of said counting means, and said logic means detects the states of said counting means indicative of a minimum value and a maximum value and inhibits said clocking means from changing the state of said counting means.

6. An automatic signal level control circuit in accordance with claim 5 further comprising presetting means connected to said logic means for indicating when an input signal is first applied to said amplifying means and said presetting means supplying an output pulse of a predetermined duration which serves to set said counting means at a preselected state in its count so as to reduce the average time which elapses before the output of said detecting means is between the thresholds of said comparing means.

7. An automatic signal level control circuit in accordance with claim 6 further comprising evaluating means connected to said logic means and said decoding means, said evaluating means comprising gating means which produce outputs indicative of two signaling conditions at the input of said signal level control circuit, the first condition being when magnitude of the input signal applied to said amplifying means is insufficient to satisfy the lower limit of said comparing means and the second condition being when the magnitude of the input signal of said level control circuit produces a signal at said comparing means exceeding the upper limit therein.

* * * * *